United States Patent
Yang (10) Patent No.: US 10,636,342 B2
(45) Date of Patent: Apr. 28, 2020

(54) ACTIVE-MATRIX ORGANIC EMISSIVE DIODE (AMOLED) DISPLAY PANEL FOR REDUCING BLUE RAY ENERGY IN DISPLAY IMAGES, DRIVING METHOD THEREOF, AND DRIVING DEVICE THEREOF

(71) Applicant: Wuhan China Star Optoelectronics Technology Co., Ltd., Wuhan, Hubei (CN)

(72) Inventor: Yong Yang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 189 days.

(21) Appl. No.: 15/532,045

(22) PCT Filed: Apr. 24, 2017

(86) PCT No.: PCT/CN2017/081587
§ 371 (c)(1),
(2) Date: May 31, 2017

(87) PCT Pub. No.: WO2018/176533
PCT Pub. Date: Oct. 4, 2018

(65) Prior Publication Data
US 2018/0286299 A1    Oct. 4, 2018

(30) Foreign Application Priority Data
Mar. 31, 2017    (CN) .......................... 2017 1 0208234

(51) Int. Cl.
*G09G 3/20*      (2006.01)
*G09G 3/3225*    (2016.01)
*H01L 27/32*     (2006.01)

(52) U.S. Cl.
CPC ......... *G09G 3/2003* (2013.01); *G09G 3/3225* (2013.01); *H01L 27/3213* (2013.01);
(Continued)

(58) Field of Classification Search
None
See application file for complete search history.

(56) References Cited

U.S. PATENT DOCUMENTS 9,013,098 B1 *   4/2015   Kim .................... H01L 27/3218
                                                        313/504
9,385,168 B2 *   7/2016   Hack ................... H01L 27/3213
(Continued)

FOREIGN PATENT DOCUMENTS

CN          1912691 A        2/2007
CN        104933981 A        9/2015
(Continued)

*Primary Examiner* — David D Davis
(74) *Attorney, Agent, or Firm* — Andrew C. Cheng (57) ABSTRACT

The present disclosure discloses an AMOLED display panel, a driving method thereof, and a driving device thereof. The AMOLED display panel includes a plurality of pixel structures arranged in a matrix, and each of the pixel structures includes at least one red sub-pixel R, at least one green sub-pixel, and at least one blue sub-pixel. The blue sub-pixels of the pixel structures arranged in odd columns respectively have a first emissive peak wavelength, and the blue sub-pixels of the pixel structures arranged in even columns respectively have a second emissive peak wavelength. The first emissive peak wavelength is greater than the second emissive peak wavelength.

12 Claims, 4 Drawing Sheets

(52) U.S. Cl.
CPC .............. *G09G 2300/0452* (2013.01); *G09G 2320/0242* (2013.01); *G09G 2320/062* (2013.01); *G09G 2320/0666* (2013.01)

(56) References Cited

U.S. PATENT DOCUMENTS

| | | | | |
|---|---|---|---|---|
| 9,424,772 B2* | 8/2016 | Hack | .................... | G09G 3/3208 |
| 2012/0147065 A1* | 6/2012 | Byun | .................... | G09G 3/3208 |
| | | | | 345/690 |
| 2013/0105778 A1* | 5/2013 | Kim | .................... | H01L 27/3213 |
| | | | | 257/40 |
| 2013/0285537 A1* | 10/2013 | Chaji | .................... | H01L 27/322 |
| | | | | 313/504 |
| 2014/0077688 A1* | 3/2014 | Weaver | ............... | H01L 51/5004 |
| | | | | 313/504 |
| 2014/0203244 A1* | 7/2014 | Hack | .................... | H01L 27/3213 |
| | | | | 257/40 |
| 2014/0327709 A1* | 11/2014 | Hack | .................... | G09G 3/3208 |
| | | | | 345/694 |
| 2016/0129218 A1 | 5/2016 | Mok | | |
| 2016/0133675 A1* | 5/2016 | Yata | .................... | H01L 27/3218 |
| | | | | 257/89 |
| 2017/0004751 A1* | 1/2017 | Seo | .................... | G09G 3/3233 |
| 2017/0207281 A1* | 7/2017 | Hack | .................... | H01L 27/3206 |
| 2018/0033839 A1* | 2/2018 | Hack | .................... | H01L 27/3213 |
| 2018/0166512 A1* | 6/2018 | Hack | .................... | H01L 27/3218 |

FOREIGN PATENT DOCUMENTS

| | | |
|---|---|---|
| CN | 105467651 A | 4/2016 |
| CN | 105575311 A | 5/2016 |
| CN | 106531046 A | 3/2017 |

\* cited by examiner

FIG. 6

ACTIVE-MATRIX ORGANIC EMISSIVE DIODE (AMOLED) DISPLAY PANEL FOR REDUCING BLUE RAY ENERGY IN DISPLAY IMAGES, DRIVING METHOD THEREOF, AND DRIVING DEVICE THEREOF

BACKGROUND OF THE INVENTION

1. Field of the Invention

The present disclosure relates to a display technology, and more particularly to a AMOLED display panel, a driving method of the AMOLED display panel, and a driving device of the AMOLED display panel.

2. Discussion of the Related Art

Organic Emissive Diodes (OLEDs) have a characteristics of self-luminous. The OLEDs are adapted to a very thin organic coating and a glass substrates. When a current flows through the OLED, organic material may emitting light. An OLED display screen has a large viewing angle, and may significantly save electric energy. Therefore, the OLED is widely used. A driving method of the OLED is separated to a passive driving method and a active driving method. The passive driving method drives Passive Matrix Organic Emissive Diodes (PMOLEDs), and the active driving method drives Active Matrix Organic Emissive Diodes (AMOLEDs). It is difficult to built a large size PMOLEDs. In order to maintain luminance of a panel, operation current may be enhanced to increase luminance of each pixels, and a service life may be decreased. Therefore, the AMOLEDs are more and more popular. The AMOLEDs compared with a conventional liquid crystal display (LCD), the AMOLEDs have characteristics for fast response, high contrast, and wide viewing angle. Further, the AMOLEDs have a characteristic of self-luminous, and the AMOLEDs may not use a backlight board. Therefore, the AMOLEDs may be thinner than the conventional LCD, and a cost of the backlight board may be saved. A wide range of advantages make the AMOLED a good prospect.

A structure of an AMOLED display panel includes: a Thin-Film Transistor (TFT) matrix base board, and pixel structures arranged on the TFT matrix base board. The AMOLED display panel usually implements display effects with different colors by a mixture of the R, G, B three primary colors. Therefore, a pixel of an OLED display panel usually include R, G, B three emissive units.

Medical studies have shown that in the visible lights emitted from a display panel, blue ray has the shortest wavelength and the most powerful energy. The blue ray as the visible light having most powerful energy includes blue ray, indigo ray, and violet ray. They penetrate the cornea and the crystal directly into the macula, to accelerate the macular cell oxidation, so that retinal photoreceptor damage. The blue ray damage to the retina is a chain reaction. Since A2E has an absorption peak in ultraviolet ray region and blue ray region, no matter the ultraviolet ray or the blue ray may excite A2E to release free radicals. Therefore, the A2E may more effectively damage the retinal pigment epithelium, may cause the retinal pigment epithelium atrophy, and may cause light-sensitive cells death. A function of the light-sensitive cells is to accept incident light, and to transform light signals to electrical signals. The light-sensitive cells further transmit the electrical signals to a brain to image through visual nerve. The death of light-sensitive cells may lead to a gradual decline in vision or even complete loss.

The AMOLED display panel has unsatisfactory performance for protect the health of eyes. Therefore, the improvement of this problem is one of the urgent problems to be solved in the industry.

SUMMARY

The present disclosure relates to AMOLED display panels for effectively reducing blue ray energy in displayed images to achieve an eye protection function with low blue ray energy.

In one aspect, an Active-Matrix Organic Emissive Diode (AMOLED) display panel, including: a plurality of pixel structures arranged in a matrix; wherein each of the pixel structures includes at least one red sub-pixel, at least one green sub-pixel, and at least one blue sub-pixel; wherein the blue sub-pixels of the pixel structures arranged in odd columns of the matrix respectively have a first emissive peak wavelength, and the blue sub-pixels of the pixel structures arranged in even columns of the matrix respectively have a second emissive peak wavelength; or wherein the blue sub-pixels of the pixel structures arranged in odd columns of the matrix respectively have the second emissive peak wavelength, and the blue sub-pixels of the pixel structures arranged in even columns of the matrix respectively have the first emissive peak wavelength; wherein the first emissive peak wavelength is smaller than the second emissive peak wavelength.

Wherein the red sub-pixels, the green sub-pixels, or the blue sub-pixels of the pixel structures respectively comprises an anode layer, a electron hole transport layer, an emissive layer, an electron transport layer, and a cathode layer being stacked in sequence; wherein an emissive color and an emissive peak wavelength are determined by an emissive material of the emissive layer.

Wherein the first emissive peak wavelength is in a range from 430 nm to 445 nm, and the second emissive peak wavelength is in a range from 450 nm to 465 nm.

Wherein the blue sub-pixels of the pixel structures arranged in odd columns receive driving signals through a first flexible circuit board, and the blue sub-pixels of the pixel structures arranged in even columns receive driving signals through a second flexible circuit board; or wherein the green sub-pixel of each of the pixel structures is arranged in m-th column and n-th row of each of the pixel structures, the red sub-pixel of each of the pixel structures is arranged in m-th column and (n+1)-th row of each of the pixel structures, and the blue sub-pixel of each of the pixel structures is arranged in (m+1)-th column and n-th to (n+1)-th rows of each of the pixel structures; wherein m and n are respectively an odd number.

In another aspect, a driving method of the AMOLED display panel, including: determining whether a blue ray saturation of a displayed image frame reaches a saturation threshold; with respect to the blue sub-pixels in the image frame, driving the blue sub-pixels having the second emissive peak wavelength to display upon determining the blue ray saturation of the displayed image frame reaches the saturation threshold; with respect to the blue sub-pixels in the image frame, simultaneously driving the blue sub-pixels having the first emissive peak wavelength and the blue sub-pixels having the second emissive peak wavelength to display upon determining the blue ray saturation of the displayed image frame does not reach the saturation threshold.

Wherein when driving the blue sub-pixels having the second emissive peak wavelength to display, the driving signals of the blue sub-pixels having the second emissive peak wavelength are enhanced to increase luminance of the blue sub-pixels.

Wherein the saturation threshold is in a range from 50% to 60%.

In another aspect, a driving device of the AMOLED display panel, including: an image input unit, configured to receive image data of a displayed image frame; an image analyze unit, configured to calculate a blue ray saturation of the displayed image frame, and compare the blue ray saturation with a saturation threshold; an image output unit, comprising a driving circuit module to output driving signals to the pixel structures of the display panel according to the image data of the displayed image frame, and to drive a current displayed image; wherein the blue sub-pixels of the pixel structures arranged in odd columns is connected to the driving circuit module through a first flexible circuit board, and the blue sub-pixels of the pixel structures arranged in even columns is connected to the driving circuit module through a second flexible circuit board; wherein with respect to the blue sub-pixels in the image frame, when blue ray saturation of the displayed image frame is greater than the saturation threshold, the driving circuit module drives the blue sub-pixels having the second emissive peak wavelength to display; wherein with respect to the blue sub-pixels in the image frame when blue ray saturation of the displayed image frame is smaller than the saturation threshold, the driving circuit module simultaneously drive the blue sub-pixels having the first emissive peak wavelength and the blue sub-pixels having the second emissive peak wavelength to display.

Wherein the image output unit further comprises a signal offset module; wherein when driving the blue sub-pixels having the second emissive peak wavelength to display, the signal offset module offsets the driving signals of the blue sub-pixels having the second emissive peak wavelength to increase luminance of the blue sub-pixels.

Wherein the saturation threshold is in a range from 50% to 60%.

Compared to the prior art, the present disclosure provides the AMOLED display panel. The peak wavelengths of the blue sub-pixels arranged in odd columns are greater than the peak wavelengths the blue sub-pixels arranged in even columns, or the peak wavelengths of the blue sub-pixels arranged in even columns are greater than the peak wavelengths the blue sub-pixels arranged in odd columns. When the AMOLED display panel is driven to display, the blue sub-pixels having the greater emissive peak wavelength are driven or the all blue sub-pixels are simultaneously driven according to determine whether a blue ray saturation of a displayed image frame reaches a saturation threshold. Some of the all blue sub-pixels are the blue sub-pixels having the greater emissive peak wavelength. Therefore, the AMOLED display panel may effectively reduce blue ray energy in displayed images to achieve an eye protection function with low blue ray energy.

DETAILED DESCRIPTION OF THE EMBODIMENTS

Embodiments of the invention will now be described more fully hereinafter with reference to the accompanying drawings, in which embodiments of the invention are shown.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

Figure 1:
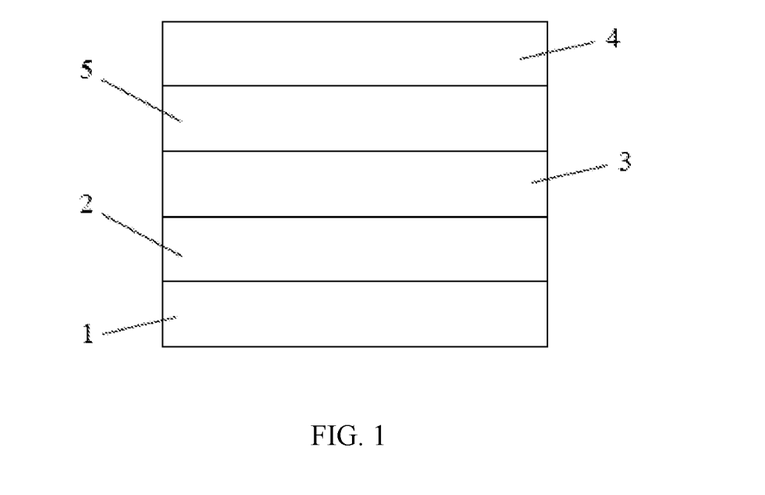
FIG. 1 is a schematic view of a structure of the AMOLED display panel provided in one embodiment of the present disclosure.
Figure 2:
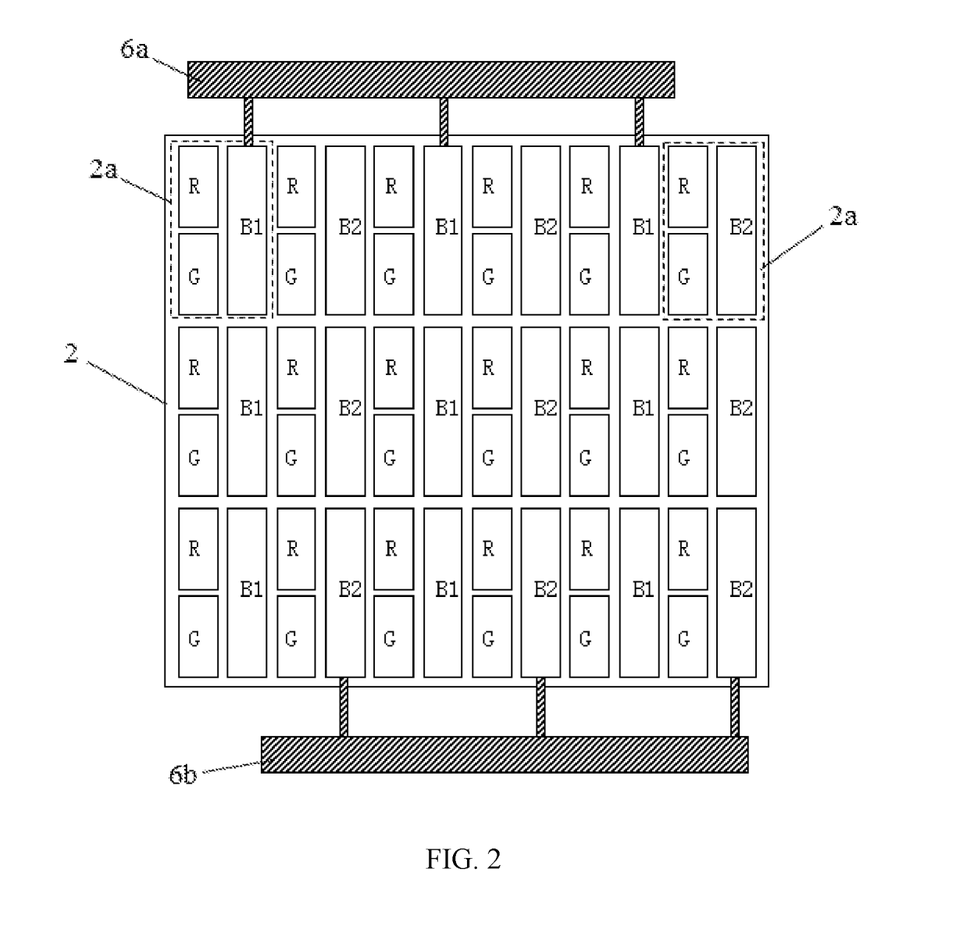
FIG. 2 is a schematic view of a pixel structure layer of one embodiment of the present disclosure.

In the embodiment, an AMOLED display panel is provided. As shown in FIG. 1, the AMOLED display panel includes a Thin-Film Transistor (TFT) matrix base board 1, and pixel structure layer 2 arranged on the TFT matrix base board 1. An encapsulation layer 3 and a protective cover 4 are mounted on the pixel structure layer 2. As shown in FIG. 2, the pixel structure layer 2 includes a plurality of pixel structures 2a arranged in a matrix, and each of the pixel structures 2a includes at least one red sub-pixel R, at least one green sub-pixel G, and at least one blue sub-pixel B1,B2. It should be noted that FIG. 2 only shows some rows and some columns of the pixel structures 2a.

In the embodiment, as shown in FIG. 2, the red sub-pixel R, the green sub-pixel G, and the blue sub-pixel B1,B2 of the pixel structures 2a are arranged as the following structure: the red sub-pixel R is a sub-pixel arranged in m-th column and n-th row, the green sub-pixel G is a sub-pixel arranged in m-th column and (n+1)-th row, and the blue sub-pixel B1,B2 is a sub-pixel arranged in (m+1)-th column and n-th to (n+1)-th rows. The m and the n are respectively an odd number. Take the pixel structure 2a located adjacent to the upper-left corner in FIG. 2 for an example. The red sub-pixel R is a sub-pixel located at the first column and the first row, the green sub-pixel G is a sub-pixel located at the first column and the second row, and the blue sub-pixel B1 is a sub-pixel located at the second column and first to second rows. This arrangement may be seen as a specific form of the pentile arrangement.

Figure 3:
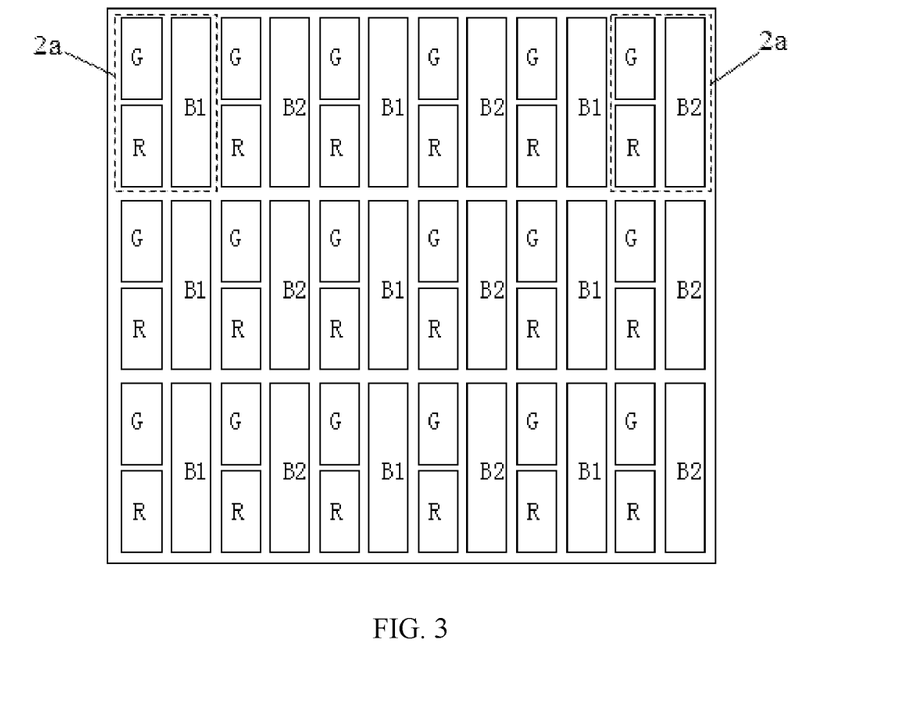
FIG. 3 is a schematic view of a pixel structure layer of the other embodiment of the present disclosure.

In the other embodiment, as shown in FIG. 3, the red sub-pixel R, the green sub-pixel G, and the blue sub-pixel B1,B2 of the pixel structures 2a are arranged as the following structure: the green sub-pixel G is a sub-pixel arranged in m-th column and n-th row, the red sub-pixel R is a sub-pixel arranged in m-th column and (n+1)-th row, and the blue sub-pixel B1,B2 is a sub-pixel arranged in (m+1)-th column and n-th to (n+1)-th rows. The m and the n are respectively an odd number.

However, in another embodiments, the arrangement of the red sub-pixel R, the green sub-pixel G, and the blue sub-pixel B1,B2 may be adapted to any arrangement of the prior art.

Figure 4:
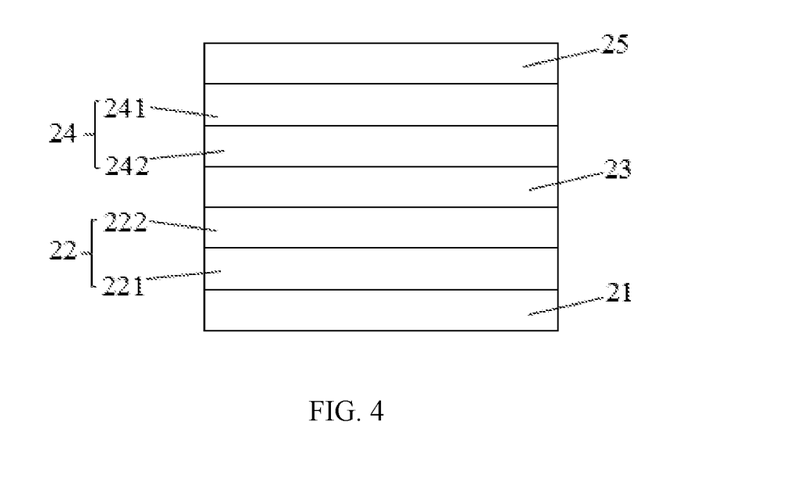
FIG. 4 is a schematic view of a sub-pixel of one embodiment of the present disclosure.

Specifically, as shown in FIG. 4, the red sub-pixel R, the green sub-pixel G, and the blue sub-pixel B1,B2 respectively includes an anode layer 21, a electron hole transport layer (HTL) 22, an emissive layer (EML) 23, an electron transport layer (ETL) 24, and a cathode layer 25 being stacked in sequence. An emissive color and an emissive peak wavelength are determined by an emissive material of the emissive layer 23. For example, the emissive layer 23 of the red sub-pixel R may selects an emissive material emitting red light. The emissive layer 23 of the green sub-pixel G may selects an emissive material emitting green light. The emissive layer 23 of the blue sub-pixel B1,B2 may selects an emissive material emitting blue light. More specifically, the electron hole transport layer 22 includes a electron hole injection layer 221, and a electron hole transportation layer 222 arranged in sequence according to a direction away from the anode layer 21. The electron hole injection layer 221 and the electron hole transportation layer 222 have similar functions. Therefore, the electron hole injection layer 221 and the electron hole transportation layer 222 may be collectively called the electron hole transport layer 22. The electron transport layer 24 includes an electron injection layer 241, and an electron transportation layer 242 arranged in sequence according to a direction away from the cathode layer 25. The electron injection layer 241 and the electron transportation layer 242 have similar functions. Therefore, the electron injection layer 241 and the electron transportation layer 242 may be collectively called the electron transport layer 24.

An operation principle of the AMOLED display panel is that under the action of an electric field between the anode layer 21 and the cathode layer 25, electron holes are transmitted to the emissive layer 23 through the hole transport layer 22, and electrons are transmitted to the emissive layer 23 through the electron transport layer 24. The electron holes and the electrons recombine to emit light in the emissive layer 23. The AMOLED display panel usually implements display effects with different colors by a mixture of the R, G, B three primary colors. Therefore, each of the pixel structures 2a usually includes the red sub-pixel R, the green sub-pixel G, and the blue sub-pixel B1,B2, three emissive units. Usually, the three emissive units of each of the pixel structures may be respectively controlled by a driving circuit. Specifically, the anode layers 21 of the red sub-pixel R, the green sub-pixel G, and the blue sub-pixel B1,B2 are respectively electrically connected to one thin-film transistor of the TFT matrix base board 1. The thin-film transistors respectively drive one emissive unit.

In the embodiment, as shown in FIG. 2, the pixel structure layer 2 includes a plurality of pixel structures 2a arranged in the matrix. The blue sub-pixels B1 of the pixel structures arranged in odd columns respectively have a first emissive peak wavelength, and the blue sub-pixels B2 of the pixel structures arranged in even columns respectively have a second emissive peak wavelength. The first emissive peak wavelength is smaller than the second emissive peak wavelength. Specifically, a blue emissive material of the emissive layer 23 of the blue sub-pixel B1 is similar with the prior art. The first emissive peak wavelength is in a range from 430 nm to 445 nm which belongs to short wavelength and high energy blue light. The emissive layer 23 of the blue sub-pixel B2 selects a long wavelength and low energy blue emissive material compared to the prior art. The second emissive peak wavelength is in a range from 450 nm to 465 nm. It should be noted that, in other embodiments, the blue sub-pixels B1 of the pixel structures arranged in odd columns respectively have the second emissive peak wavelength, and the blue sub-pixels B2 of the pixel structures arranged in even columns respectively have the first emissive peak wavelength.

With reference to FIG. 2, the blue sub-pixels B1 of the pixel structures arranged in odd columns receive driving signals through a first flexible circuit board 6a, and the blue sub-pixels B2 of the pixel structures arranged in even columns receive driving signals through a second flexible circuit board 6b. In the AMOLED display panel, the blue sub-pixels B1,B2 may be separated into two different types. One type of the blue sub-pixel B1 has the first emissive peak wavelength, and the other type of the blue sub-pixel B2 has the second emissive peak wavelength. The two different types of the blue sub-pixels B1,B2 are respectively connected to a driving device through different flexible circuit board to respectively receive respective driving signals from the driving device. It is should be note that the present disclosure may not change driving signals of the red sub-pixel R and the green sub-pixel G. Therefore, the red sub-pixel R and the green sub-pixel G may be connected to the driving device as the prior art, and circuit boards respectively connected to the red sub-pixel R and the green sub-pixel G may not shown in FIG. 2.

With reference to FIG. 1, in the embodiment, the AMOLED display panel further includes a touch screen 5. The touch screen 5 is mounted between the encapsulation layer 3 and the protective cover 4. A substrate of the TFT matrix base board 1 may be a rigid substrate, such as a glass substrate, or may be a flexible substrate, such as a polyimide (PI) substrate.

The embodiment further provides a driving method of the AMOLED display panel and a driving device of the AMOLED display panel.

Figure 5:
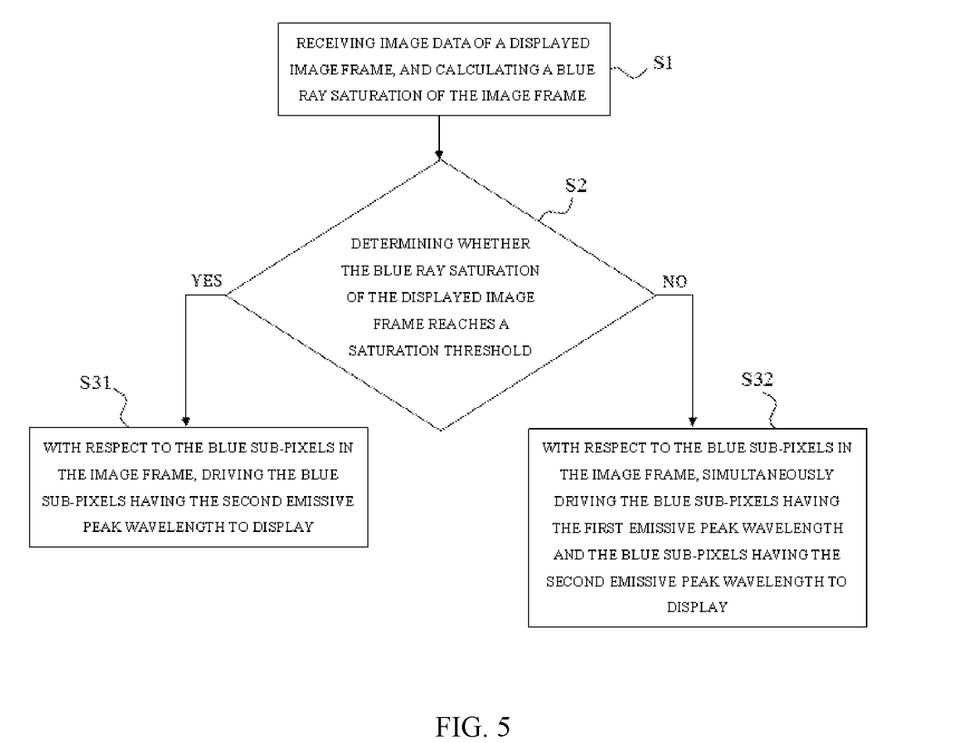
FIG. 5 is a flowchart of a sub-pixel of a driving method of an AMOLED display panel provided in one embodiment of the present disclosure.

With reference to FIG. 5, the driving method of the AMOLED display panel of the embodiment includes:

S1: receiving image data of a displayed image frame, and calculating a blue ray saturation of the image frame;

S2: determining whether the blue ray saturation of the displayed image frame reaches a saturation threshold;

S31: with respect to the blue sub-pixels in the image frame, driving the blue sub-pixels having the second emissive peak wavelength to display upon determining the blue ray saturation of the displayed image frame reaches the saturation threshold. When the blue ray saturation of the displayed image frame is greater than the saturation threshold, only the blue sub-pixels emitting long wavelength and low energy blue light are driven to display. Therefore, screen luminance may be ensured, and/or short wavelength and high energy blue light may be filter out to achieve an eye protection function with low blue ray energy.

S32: with respect to the blue sub-pixels in the image frame, simultaneously driving the blue sub-pixels having the first emissive peak wavelength and the blue sub-pixels having the second emissive peak wavelength to display upon determining the blue ray saturation of the displayed image frame does not reach the saturation threshold. When the blue ray saturation of the displayed image frame is smaller than the saturation threshold, all the blue sub-pixels emitting long wavelength and low energy blue light and/or short wavelength and high energy blue light are driven to display to ensure the screen luminance and color fidelity. Since some blue sub-pixels emits long wavelength and low energy blue light, blue light energy may be decrease compared with the prior art to achieve an eye protection function with low blue ray energy.

It is should be note that the present disclosure may not change driving signals of the red sub-pixel and the green sub-pixel. Therefore, the red sub-pixel and the green sub-pixel may be driven as the prior art.

In the driving method, the saturation threshold may be set according to actual needs, and usually the saturation threshold may be in a range from 50% to 60%. The most preferred value is 50%.

In the step S31 of the embodiment, when driving the blue sub-pixels having the second emissive peak wavelength to display, the driving signals, such as driving currents, of the blue sub-pixels having the second emissive peak wavelength are enhanced to increase luminance of the blue sub-pixels. Since only the blue sub-pixels emitting long wavelength and low energy blue light are driven, the luminance of the blue sub-pixels may be increased to ensure the screen luminance.

Figure 6:
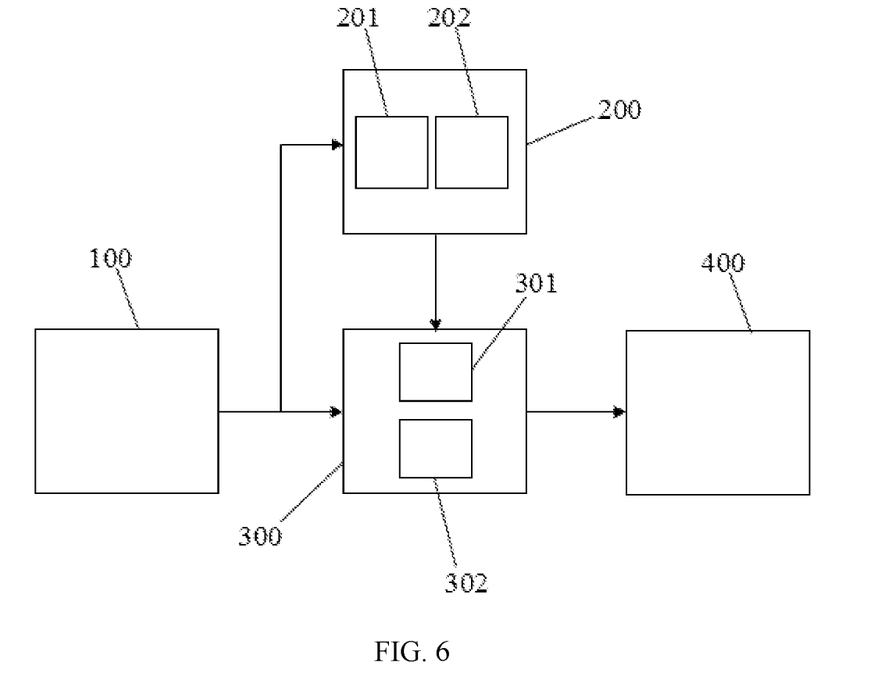
FIG. 6 is a schematic view of a driving device of an AMOLED display panel provided in one embodiment of the present disclosure.

With reference to FIG. 6, the driving device of the AMOLED display panel of the embodiment include an image input unit 100, an image analyze unit 200, and an image output unit 300.

The image input unit 100 is configured to receive image data of a displayed image frame, and transmit the image data to the image analyze unit 200 and the image output unit 300.

The image analyze unit 200 includes a calculation module 201, and a comparing module 202. The calculation module 201 calculates a blue ray saturation of the displayed image frame. The comparing module 202 have a saturation threshold and compares the blue ray saturation with the saturation threshold. The comparing module 202 further transmits a comparing result to the image output unit 300. The saturation threshold may be set according to actual needs, and usually the saturation threshold may be in a range from 50% to 60%. The most preferred value is 50%.

The image output unit 300 includes a driving circuit module 301. The driving circuit module 301 outputs driving signals to the pixel structures of the display panel 400 to drive a current displayed image according to the image data of the displayed image frame. It is should be note that the display panel 400 is the AMOLED display panel provided by the present disclosure. The blue sub-pixels emitting long wavelength and low energy blue light and/or short wavelength and high energy blue light are respectively connected to the image output unit 300 through different flexible printed circuit boards (FPC). The image output unit 300 may respectively drives the blue sub-pixels emitting long wavelength and low energy blue light and/or short wavelength and high energy blue light. Specifically, with reference to FIG. 2, the first flexible circuit board 6a and the second flexible circuit board 6b are respectively connected to the driving circuit module 301 of the image output unit 300.

With respect to the blue sub-pixels in the image frame, when blue ray saturation of the displayed image frame is greater than the saturation threshold, the driving circuit module 301 drives the blue sub-pixels having the second emissive peak wavelength to display. With respect to the blue sub-pixels in the image frame when blue ray saturation of the displayed image frame is smaller than the saturation threshold, the driving circuit module 301 simultaneously drive the blue sub-pixels having the first emissive peak wavelength (short wavelength and high energy) and the blue sub-pixels having the second emissive peak wavelength (long wavelength and low energy) to display.

With reference to FIG. 6, the image output unit 300 further includes a signal offset module 302. When driving the blue sub-pixels having the second emissive peak wavelength to display, the signal offset module 302 offsets the driving signals of the blue sub-pixels having the second emissive peak wavelength to increase luminance of the blue sub-pixels.

In conclusion, the present disclosure provides the AMOLED display panel, the driving method thereof, and the driving device thereof. The peak wavelengths of the blue sub-pixels arranged in odd columns are greater than the peak wavelengths the blue sub-pixels arranged in even columns, or the peak wavelengths of the blue sub-pixels arranged in even columns are greater than the peak wavelengths the blue sub-pixels arranged in odd columns. When the AMOLED display panel is driven to display, the blue sub-pixels having the greater emissive peak wavelength are driven or the all blue sub-pixels are simultaneously driven according to determine whether a blue ray saturation of a displayed image frame reaches a saturation threshold. Some of the all blue sub-pixels are the blue sub-pixels having the greater emissive peak wavelength. Therefore, the AMOLED display panel may effectively reduce blue ray energy in displayed images to achieve an eye protection function with low blue ray energy.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. An Active-Matrix Organic Emissive Diode (AMOLED) display panel, comprising:
    a plurality of pixel structures arranged in a matrix;
    wherein each of the pixel structures comprises at least one red sub-pixel, at least one green sub-pixel, and at least one blue sub-pixel;
    wherein the blue sub-pixels of the pixel structures arranged in odd columns of the matrix respectively have a first emissive peak wavelength, and the blue sub-pixels of the pixel structures arranged in even columns of the matrix respectively have a second emissive peak wavelength; or wherein the blue sub-pixels of the pixel structures arranged in odd columns of the matrix respectively have the second emissive peak wavelength, and the blue sub-pixels of the pixel structures arranged in even columns of the matrix respectively have the first emissive peak wavelength;
    wherein the first emissive peak wavelength is smaller than the second emissive peak wavelength; and wherein the blue sub-pixel of each of the pixel structures spans across two rows, and both of the red sub-pixel and the green sub-pixel respectively span across one row;

wherein the blue sub-pixels of the pixel structures arranged in odd columns receive driving signals through a first flexible circuit board, and the blue sub-pixels of the pixel structures arranged in even columns receive driving signals through a second flexible circuit board, such that the driving signals being provided to the blue sub-pixels in odd columns are different from the driving signals being provided to the blue sub-pixels in even columns upon determining a blue ray saturation of a displayed image frame reaches a saturation threshold.

2. The AMOLED display panel as claimed in claim 1, wherein the red sub-pixels, the green sub-pixels, or the blue sub-pixels of the pixel structures respectively comprises an anode layer, a electron hole transport layer, an emissive layer, an electron transport layer, and a cathode layer being stacked in sequence;

wherein an emissive color and an emissive peak wavelength are determined by an emissive material of the emissive layer.

3. The AMOLED display panel as claimed in claim 1, wherein the first emissive peak wavelength is in a range from 430 nm to 445 nm, and the second emissive peak wavelength is in a range from 450 nm to 465 nm.

4. The AMOLED display panel as claimed in claim 1, wherein the red sub-pixel of each of the pixel structures is arranged in m-th column and n-th row of each of the pixel structures, the green sub-pixel of each of the pixel structures is arranged in m-th column and (n+1)-th row of each of the pixel structures, and the blue sub-pixel of each of the pixel structures is arranged in (m+1)-th column and n-th to (n+1)-th rows of each of the pixel structures.

5. The AMOLED display panel as claimed in claim 1, wherein the green sub-pixel of each of the pixel structures is arranged in m-th column and n-th row of each of the pixel structures, the red sub-pixel of each of the pixel structures is arranged in m-th column and (n+1)-th row of each of the pixel structures, and the blue sub-pixel of each of the pixel structures is arranged in (m+1)-th column and n-th to (n+1)-th rows of each of the pixel structures;

wherein m and n are respectively an odd number.

6. A driving device of an AMOLED display panel, wherein the AMOLED display panel comprise a plurality of pixel structures arranged in a matrix;

wherein each of the pixel structures comprises at least one red sub-pixel, at least one green sub-pixel, and at least one blue sub-pixel;

wherein the blue sub-pixels of the pixel structures arranged in odd columns of the matrix respectively have a first emissive peak wavelength, and the blue sub-pixels of the pixel structures arranged in even columns of the matrix respectively have a second emissive peak wavelength; or wherein the blue sub-pixels of the pixel structures arranged in odd columns of the matrix respectively have the second emissive peak wavelength, and the blue sub-pixels of the pixel structures arranged in even columns of the matrix respectively have the first emissive peak wavelength;

wherein the first emissive peak wavelength is smaller than the second emissive peak wavelength; and wherein the blue sub-pixel spans across two rows, and both of the red sub-pixel and the green sub-pixel respectively span across one row;

wherein the blue sub-pixels of the pixel structures arranged in odd columns receive driving signals through a first flexible circuit board, and the blue sub-pixels of the pixel structures arranged in even columns receive driving signals through a second flexible circuit board, such that the driving signals being provided to the blue sub-pixels in odd columns are different from the driving signals being provided to the blue sub-pixels in even columns upon determining a blue ray saturation of a displayed image frame reaches a saturation threshold;

wherein the driving device comprise:

an image input unit, configured to receive image data of the displayed image frame;

an image analyze unit, configured to calculate the blue ray saturation of the displayed image frame, and compare the blue ray saturation with the saturation threshold;

an image output unit, comprising a driving circuit module to output driving signals to the pixel structures of the display panel according to the image data of the displayed image frame, and to drive a current displayed image; wherein the blue sub-pixels of the pixel structures arranged in odd columns is connected to the driving circuit module through a first flexible circuit board, and the blue sub-pixels of the pixel structures arranged in even columns is connected to the driving circuit module through a second flexible circuit board;

wherein with respect to the blue sub-pixels in the image frame, when blue ray saturation of the displayed image frame is greater than the saturation threshold, the driving circuit module drives the blue sub-pixels having the second emissive peak wavelength to display;

wherein with respect to the blue sub-pixels in the image frame when blue ray saturation of the displayed image frame is smaller than the saturation threshold, the driving circuit module simultaneously drive the blue sub-pixels having the first emissive peak wavelength and the blue sub-pixels having the second emissive peak wavelength to display.

7. The driving device of the AMOLED display panel as claimed in claim 6, wherein the image output unit further comprises a signal offset module;

wherein when driving the blue sub-pixels having the second emissive peak wavelength to display, the signal offset module offsets the driving signals of the blue sub-pixels having the second emissive peak wavelength to increase luminance of the blue sub-pixels.

8. The driving device of the AMOLED display panel as claimed in claim 7, wherein the saturation threshold is in a range from 50% to 60%.

9. The driving device of the AMOLED display panel as claimed in claim 6, wherein the saturation threshold is in a range from 50% to 60%.

10. The driving device of the AMOLED display panel as claimed in claim 6, wherein the red sub-pixels, the green sub-pixels, or the blue sub-pixels of the pixel structures respectively comprises an anode layer, a electron hole transport layer, an emissive layer, an electron transport layer, and a cathode layer being stacked in sequence;

wherein an emissive color and an emissive peak wavelength are determined by an emissive material of the emissive layer;

wherein the first emissive peak wavelength is in a range from 430 nm to 445 nm, and the second emissive peak wavelength is in a range from 450 nm to 465 nm.

11. The driving device of the AMOLED display panel as claimed in claim 6, wherein the red sub-pixel of each of the pixel structures is arranged in m-th column and n-th row of each of the pixel structures, the green sub-pixel of each of the pixel structures is arranged in m-th column and (n+1)-th row of each of the pixel structures, and the blue sub-pixel of each of the pixel structures is arranged in (m+1)-th column and n-th to (n+1)-th rows of each of the pixel structures.

12. The driving device of the AMOLED display panel as claimed in claim 6, wherein the green sub-pixel of each of the pixel structures is arranged in m-th column and n-th row of each of the pixel structures, the red sub-pixel of each of the pixel structures is arranged in m-th column and (n+1)-th row of each of the pixel structures, and the blue sub-pixel of each of the pixel structures is arranged in (m+1)-th column and n-th to (n+1)-th rows of each of the pixel structures;

wherein m and n are respectively an odd number.

* * * * *